Figure 1:
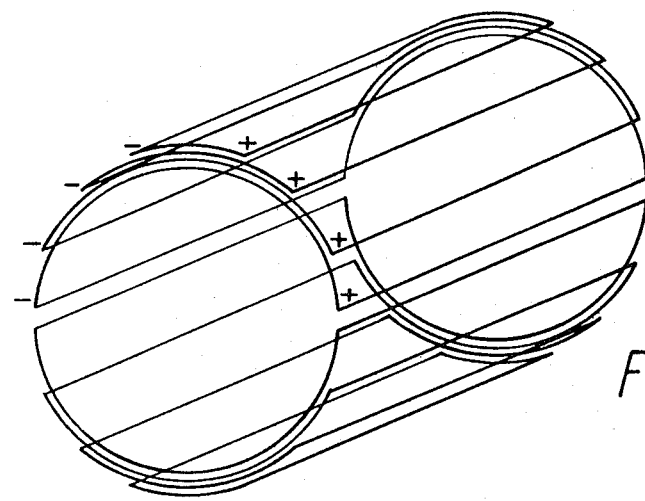

United States Patent [19]

Bull et al.

[11] 4,339,718

[45] Jul. 13, 1982

[54] COIL ARRANGEMENTS

[75] Inventors: Eric W. Bull, Sunbury-on-Thames; Robert D. Galloway, Weybridge, both of England

[73] Assignee: Picker International Limited, Wembley, England

[21] Appl. No.: 151,612

[22] Filed: May 20, 1980

[30] Foreign Application Priority Data

May 25, 1979 [GB] United Kingdom ............... 7918403

[51] Int. Cl.³ .......................................... G01N 27/00
[52] U.S. Cl. ..................................... 324/319; 324/320
[58] Field of Search ................................. 324/318–320

[56] References Cited

U.S. PATENT DOCUMENTS 3,564,398  2/1971  Nelson ................................ 324/320
3,569,823  3/1971  Golay ................................. 324/320
3,582,779  6/1971  Bloom ................................ 324/320
4,231,008 10/1980  Krueger ............................. 324/320

Primary Examiner—Michael J. Tokar
Attorney, Agent, or Firm—Fleit & Jacobson

[57] ABSTRACT

For NMR purposes a uniform magnetic field has been produced by field coils. It is known to use a cosinusoidal distribution to produce a uniform field. However, a large-diameter low-inductance coil is required for NMR and it is difficult to wind a small number of turns cosinusoidally. It is proposed to use two cosinusoidal coils providing unequal and opposing fields, the required field being the resultant and the combined inductance being less than either coil individually. The coils may have different winding densities or may be at different radii or both.

6 Claims, 6 Drawing Figures

COIL ARRANGEMENTS

The present invention is related to coil arrangements for the production of magnetic fields and is particularly, although not exclusively, related to arrangements for the production of uniform magnetic fields for nuclear magnetic resonance (NMR) apparatus.

It has been proposed to use NMR apparatus for medical purposes to examine regions of interest, of for example cross-sections of the bodies of patients. Such apparatus requires uniform magnetic fields to be produced over relatively large volumes, sufficient to encompass at least the region of interest, by coils sufficiently large to allow a patient to be introduced to the examination position. The coils may for some purposes be saddle-shaped and may also be toroidal.

It is known that a cosinusoidal distribution of current conductors around a cylinder will produce a uniform transverse field therein. A true cosine distribution and consequently uniform field can therefore be provided if a sufficiently large number of conductors are provided. However if a coil has a large diameter, such as is required to surround a patient, and a low inductance is required, as is the case for NMR, it is not possible to wind a sufficient number of turns to give a field which is as uniform as would be desired.

It is an object of this invention to provide an arrangement giving a more uniform field in such circumstances.

According to the invention there is provided a coil arrangement for providing a substantially uniform magnetic field in a region, the arrangement comprising at least two sinusoidally wound coils around said region, the two coils providing, for the same coil current, unequal and opposing fields in said region to provide a magnetic field of uniformity appropriate to the least uniform of said coils with a combined inductance less than either coil individually.

Figure 2:
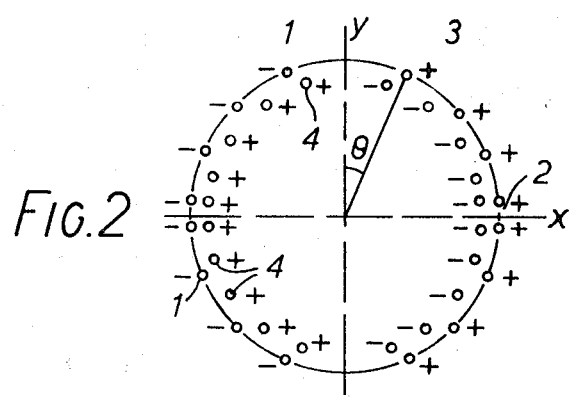
Figure 3:
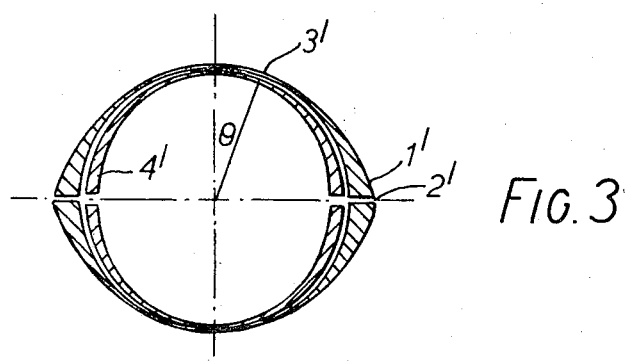
Figure 4:
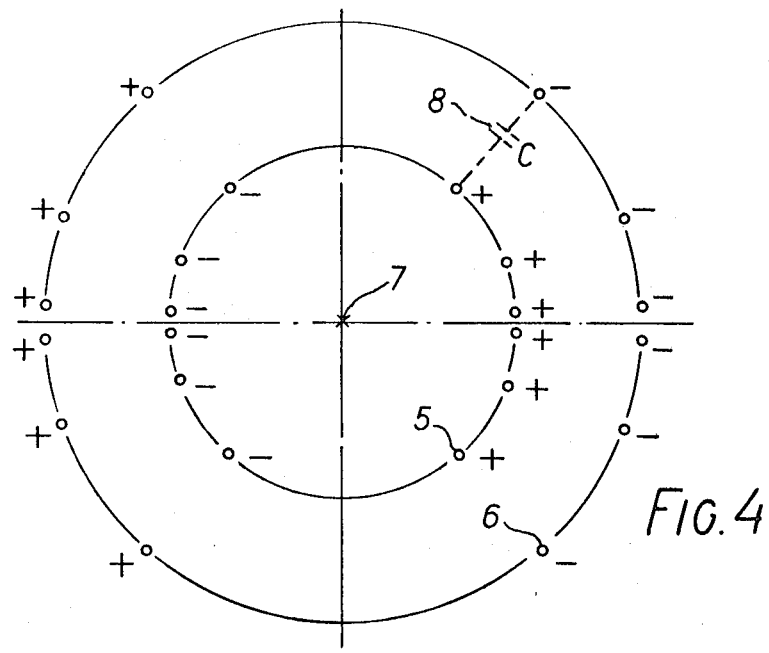
Figure 5:
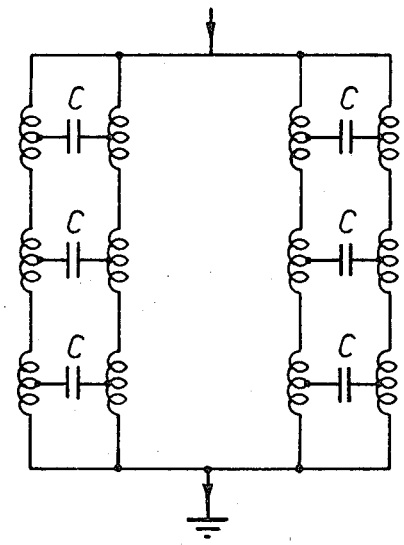
Figure 6:
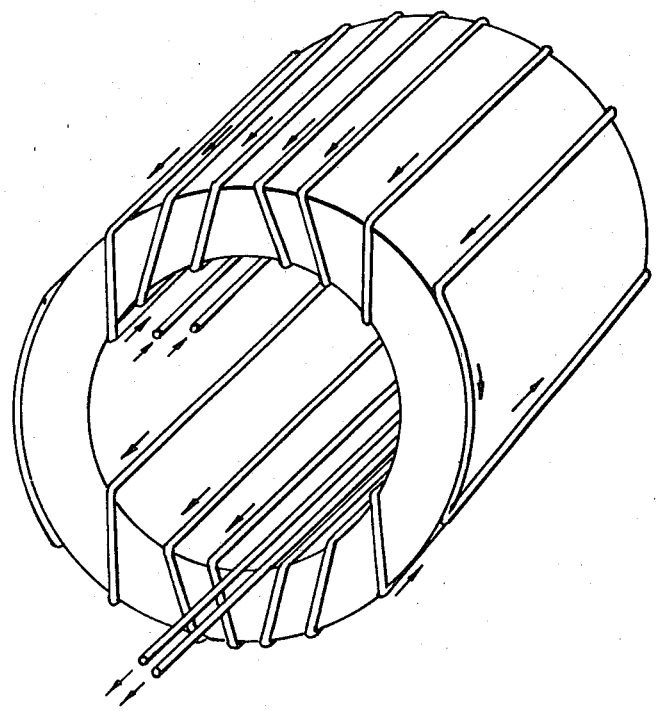

In order that the invention may be clearly understood and readily carried into effect the invention will now be described by way of example with reference to the accompanying drawings of which, FIG. 1 shows a saddle coil with a sinusoidal distribution, FIG. 2 shows a cross-section of the conductors of two such saddle coils arranged in accordance with the invention, FIG. 3 is equivalent to FIG. 2 for coils having large numbers of conductors, FIG. 4 shows an alternative arrangement of coils for the invention, FIG. 5 is an equivalent circuit for the coils of FIG. 4 and FIG. 6 shows a further alternative arrangement of coils for the invention.

In FIG. 1 there is shown a conventional saddle shaped coil having a relatively small number of conductors in a sinusoidal (or cosinusoidal depending on the choice of axes) distribution. In order to show the distribution of conductors more clearly a cross-section of the coil of FIG. 1 is shown in FIG. 2 by the conductors 1. The distribution of these is such that at 2 there are A turns per unit length of circumference while at 3, at angle $\theta$ from the y-axis, there are A sin $\theta$ turns per unit length of circumference.

In this invention it is proposed to improve field uniformity without an excessive increase of inductance by winding a second saddle shaped coil of condutors 4, in this case inside the first coil although that is not necessary. The conductors 4 are also wound in sinusoidal distribution. However for n conductors 1 there are n+x conductors 4 carrying current of the same magnitude as conductors 1 but of reverse sense. It will be appreciated that for two such opposed coils the inductance is that which would be provided by a coil of x turns but with field uniformity which can be achieved by n turns sinusoidally wound (where n>>x).

FIGS. 1 and 2 shows saddle coils having few conductors. Where many conductors are provided the coils are wound as shown in cross-section in FIG. 3. In that Figure the winding is such that at 2' there are A turns radially and at 3' there are A sin $\theta$ turns radially in coil 1'. Coil 4' is wound appropriately. In FIG. 3 the coils are shown of relative dimension that 4' has n turns and 1' has n+x turns.

It will be appreciated that the invention is not limited to saddle coils but may be applied to any coil arrangement.

Furthermore instead of using two coils with unequal numbers of turns closely spaced, connected in series there may be used concentric coils of equal or unequal numbers of turns but with opposing fields and large radial separation, connected in parallel and adjusted to give a residual difference field of high uniformity.

Such a coil arrangement is shown in FIG. 4 in which an inner coil 5 and an outer coil 6 have the same number of turns but are spaced such that the field at the axis 7 due to coil 6 is less than and opposing the field due to coil 5.

It will be appreciated that increasing radial separation of the coils reduces the capacity between them and if the coils are driven in parallel the interwinding capacities C shown at 8 will have very small voltages developed across them thus keeping the effective capacity to a low value. The equivalent circuit is shown in FIG. 5.

The embodiment of the invention in which two opposing coils are placed concentrically at different radii can be constructed by taking a non-magnetic cylindrical former and winding on to it a winding which has a turn spacing approximating a sinusoidal distribution. Such an arrangement is shown in FIG. 6 for a system in which the outer coil has more turns than the inner coil.

Other embodiments of the invention will be apparent to those skilled in the art.

What we claim is:

1. A coil arrangement having a given inductance and providing a substantially uniform magnetic field in a cylindrical region, the arrangement comprising:

a first set of conductors having a first inductance and being sinusoidally distributed around the region and extending parallel to the axis of said region so as to produce a first substantially uniform transverse magnetic field of first uniformity in said region when the coil arrangement is excited by an electric current; and a second set of conductors having a second inductance and being sinusoidally distributed around said region in a corresponding manner to the first set of conductors, so as to produce, when the coil arrangement is excited, a second substantially uniform magnetic field of second uniformity in said region which opposes and is of smaller magnitude than said first uniform magnetic field;

wherein the resultant magnetic field has a uniformity corresponding to the less uniform of the first and second uniformities of said first and second uniform fields, and the given inductance of the coil arrangement being less than either of the first and second inductances of the first and second sets of conductors individually.

2. A coil arrangement according to claim 1, wherein the first and second sets of conductors have respective angular distribution densities, and wherein the angular distribution density of the second set of conductors is lower than the angular distribution density of the first set of conductors.

3. A coil arrangement according to claim 1, wherein the first and second sets of conductors are disposed coaxially, with the second set of conductors being at a greater radius than the first set of conductors.

4. A coil arrangement according to claim 3, wherein the first and second sets of conductors have equal respective angular distribution densities.

5. A coil arrangement according to claim 1, wherein the first and second sets of conductors comprise portions of saddle coils.

6. A coil arrangement according to claim 3, wherein the first and second sets of conductors comprise portions of at least one coil wound around a non-magnetic cylindrical former surrounding said region.

* * * * *